United States Patent
Ben Jamaa

(10) Patent No.: US 9,784,786 B2
(45) Date of Patent: Oct. 10, 2017

(54) DEVICE FOR ELECTRICALLY TESTING THE INTERCONNECTIONS OF A MICROELECTRONIC DEVICE

(71) Applicant: COMMISSARIAT À L'ÉNERGIE ATOMIQUE ET AUX ÉNERGIES ALTERNATIVES, Paris (FR)

(72) Inventor: Haykel Ben Jamaa, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 330 days.

(21) Appl. No.: 14/399,302

(22) PCT Filed: Jul. 11, 2013

(86) PCT No.: PCT/EP2013/064677
§ 371 (c)(1),
(2) Date: Nov. 6, 2014

(87) PCT Pub. No.: WO2014/009470
PCT Pub. Date: Jan. 16, 2014

(65) Prior Publication Data
US 2015/0115973 A1    Apr. 30, 2015

(30) Foreign Application Priority Data

Jul. 11, 2012 (FR) .................... 12 56689

(51) Int. Cl.
*G01R 31/28* (2006.01)
*H01L 21/66* (2006.01)
*G01R 1/20* (2006.01)

(52) U.S. Cl.
CPC .......... *G01R 31/2853* (2013.01); *G01R 1/20* (2013.01); *H01L 22/14* (2013.01); *H01L 22/34* (2013.01); *H01L 2924/0002* (2013.01)

(58) Field of Classification Search
CPC .. G01R 31/002; G01R 31/26; G01R 31/2642; G01R 31/2648; G01R 31/2831;
(Continued)

(56) References Cited

U.S. PATENT DOCUMENTS 5,440,240 A * 8/1995 Wood .................. G01R 1/0466
257/E21.509
5,857,858 A * 1/1999 Gorowitz ............ H01L 25/0652
257/686
(Continued)

FOREIGN PATENT DOCUMENTS

CN        1821336 A     8/2006
IT    WO 2011101393 A1 * 8/2011    ....... H01L 21/76898
(Continued)

OTHER PUBLICATIONS

U.S. Appl. No. 14/737,761, filed Jun. 12, 2015, Jamaa, et al.
(Continued)

*Primary Examiner* — Tung X Nguyen
*Assistant Examiner* — Robert P Alejnikov, Jr.
(74) *Attorney, Agent, or Firm* — Oblon, McClelland, Maier & Neustadt, L.L.P.

(57) ABSTRACT

A simultaneous electrical testing device for TSV interconnection elements passing through a substrate and including one end connected to an integrated testing circuit and another end to a removable connection mechanism assembled to the substrate through an anisotropic conductive glue.

17 Claims, 9 Drawing Sheets

(58) Field of Classification Search
CPC .......... G01R 31/31702; G01R 33/0047; G01R 1/0491; G01R 31/265; G01R 31/3012; G01R 31/318511; H01L 2933/0033; H01L 33/48; H01L 2224/50; H01L 2225/06579; H01L 22/20; H01L 22/30; H01L 22/00; H01L 22/14; H01L 22/34; G01B 2210/56; H01S 5/0014; H02S 50/00
USPC ......... 324/537, 762.01–762.06, 538; 438/11, 438/14, 17
See application file for complete search history.

(56) References Cited

U.S. PATENT DOCUMENTS

| | | | |
|---|---|---|---|
| 6,043,670 | A | 3/2000 | Degani et al. |
| 6,278,286 | B1 | 8/2001 | Farnworth et al. |
| 6,329,829 | B1 | 12/2001 | Farnworth et al. |
| 6,529,026 | B1 | 3/2003 | Farnworth et al. |
| 7,541,203 | B1 | 6/2009 | Knickerbocker |
| 2001/0024118 | A1* | 9/2001 | Farnworth ............ G01R 1/0483 324/754.13 |
| 2010/0032629 | A1 | 2/2010 | Brule et al. |
| 2010/0155888 | A1 | 6/2010 | Christo et al. |
| 2010/0314751 | A1* | 12/2010 | Sheats .................... H01L 24/11 257/734 |
| 2011/0298488 | A1 | 12/2011 | Stillman et al. |
| 2012/0105093 | A1 | 5/2012 | Lee |
| 2013/0057312 | A1 | 3/2013 | Pagani |

FOREIGN PATENT DOCUMENTS

| | | |
|---|---|---|
| WO | 2011 101393 | 8/2011 |
| WO | WO 2011/101393 A1 | 8/2011 |

OTHER PUBLICATIONS

U.S. Appl. No. 14/745,783, filed Jun. 22, 2015, Ben Jamaa.
Po-Yuan Chen, et al., "On-Chip TSV Testing for 3D IC before Bonding Using Sense Amplification" IEEE Asian Test Symposium, 2009, pp. 450-455.
Menglin Tsai, et al., "Through Silicon Via (TSV) Defect/Pinhole Self Test Circuit for 3D-IC" IEEE International Conference on 3D System Integration, 2009, 8 Pages.
Joep Aerts, et al., "Scan Chain Design for Test Time Reduction in Core-Based ICs" IEEE International Test Conference, 1998, pp. 448-457.
Alain Phommahaxay, et al., "Ultrathin Wafer Handling in 3D Stacked IC Manufacturing Combining a Novel ZoneBOND™ Temporary Bonding Process with Room Temperature Peel Debonding" Proceedings of 3DIC, 2011, pp. 1-4.
Erik Jan Marinissen, et al., "Testing 3D Chips Containing Through-Silicon Vias" IEEE International Test Conference, 2009, pp. 1-11.
Hsien-Hsin S. Lee, et al., "Test Challenges for 3D Integrated Circuits" IEEE Design and Test of Computers, 2009, 16 Pages.
International Search Report dated Sep. 27, 2013 in PCT/EP13/064677 Filed Jul. 11, 2013.
French Search Report dated Jan. 25, 2013 in Application No. FR 1256689 Filed Jul. 11, 2012.

\* cited by examiner

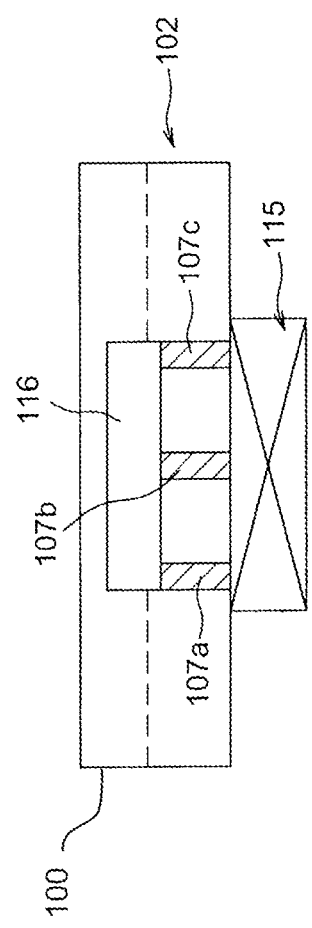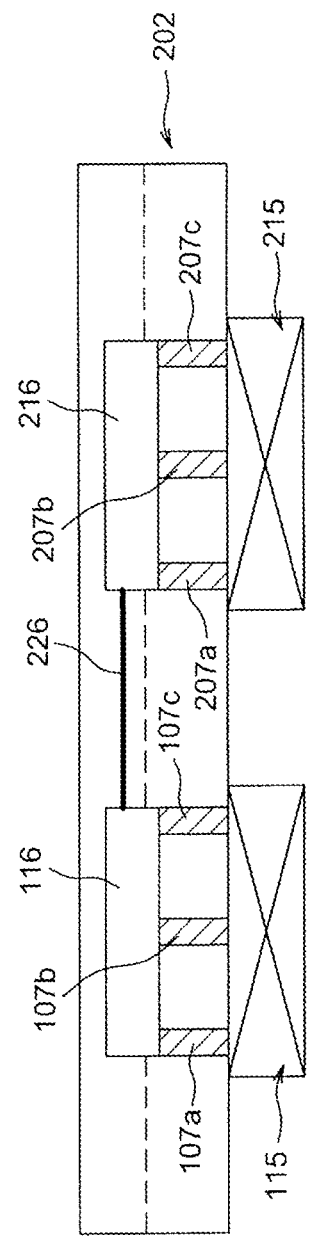

DEVICE FOR ELECTRICALLY TESTING THE INTERCONNECTIONS OF A MICROELECTRONIC DEVICE

TECHNICAL FIELD

The present application relates to the field of devices for electrically testing interconnection elements in a microelectronic device enabling the electrical continuity and/or electrical characteristics of interconnection elements passing through a carrier to be checked, in particular of vertical or TSV type interconnection elements, as well as a method for electrically testing interconnection elements.

PRIOR ART

In order to achieve a high integration density, it is known to make microelectronic devices formed by stacks of carriers or wafers, each comprising one or more chips which are thus distributed on several levels. To make interconnections in such a type of device, connection elements of the type commonly called "TSV" ("Through Silicon Via") are generally provided. These connection elements pass at least partly through the thickness of a substrate and possibly one or more wafers and carriers stacked above this substrate.

An interconnection element TSV is generally formed by at least one conductive portion passing through a carrier, for example a substrate or a chip or a plate, this conductive portion being provided with at least one end opening into one of the faces of the carrier, and with a second end which can be buried in the thickness of the carrier or even open into another face of the carrier, opposite to that into which the first end opens.

The electrical testing of devices formed by stacked wafers has several problems.

When a test is implemented on a device formed by superimposed wafers, the fragility of this device is an important parameter to be taken into account given that stacked wafers have generally been thinned beforehand.

On the other hand, with such a type of device, the number of tests to be carried out is higher than for devices formed by a single plate.

Among the electrical tests performed on such a type of device, are those performed on TSV type interconnection elements or vias.

There are different methods for electrically testing TSV vias.

Document "On-Chip TSV Testing for 3D IC before Bonding Using Sense Amplification" Po-Yuan Chen, Cheng-Wen Wu and Ding-Ming Kwai, IEEE Asian Test Symposium, 2009 discloses for example a capacitive method for testing TSV vias.

By evaluating the capacitance of a TSV via with respect to a substrate, a piece of information about the state of its filling by a conductive material and its insulation is indirectly obtained.

Document "Through Silicon Via (TSV) Defect/Pinhole Self Test Circuit for 3D-IC", by Menglin Tsai and al., IEEE International Conference on 3D System Integration, 2009 presents as for it an electrical testing method relying on a leakage current measurement between one end of a TSV via and the substrate, in order to extract therefrom a measurement signal which is then amplified for deducing therefrom the presence or not of defects in the via.

Document WO 2011/101393A1 presents as for it a system for electrically testing a microelectronic device provided with TSV interconnection elements passing through a substrate and including one end connected to a conductive layer, which can be in the form of a conductive polymer and enables a short-circuit to be set between all the interconnection elements passing through the substrate.

In document US 2012/0105093 A1, the layer of conductive polymer is replaced by a metal layer also enabling a short-circuit to be set between all the interconnection elements.

The problem arises to make an electrical test of a plurality of interconnection elements passing through a substrate without necessarily having to test all the interconnection elements passing through this substrate.

DISCLOSURE OF THE INVENTION

The present invention relates to a device or system for electrically testing a microelectronic device provided with at least one first plurality of interconnection elements passing through a substrate, the interconnection elements including a first end stripped at a first face of the substrate and connected to removable connection means, the removable connection means being provided on the first face and enabling a temporary short-circuit to be set between several of said interconnection elements, the second end of the interconnection elements being connected to a testing circuit, the testing device further comprising means for simultaneously applying to said interconnection elements, at least one connectivity testing electrical signal, between several interconnection elements of said first plurality of interconnection elements and for sampling at the output of said testing circuit a signal in response to said connectivity testing signal.

According to the invention, the removable connection means comprise a handle carrier provided with several distinct conductive areas, said conductive areas being assembled to said substrate through a layer of anisotropic conductive glue and provided facing interconnection elements of said substrate.

By anisotropic conductive glue, it is meant that this glue has electrical conduction properties only in a favoured direction z, for example orthogonal to the main plane of the substrate, while allowing an electrical insulation to be implemented in the plane xy (the plane xy making a non-zero angle with the direction z and can be in particular orthogonal to the direction z), for example parallel to the main plane of the substrate.

Thus, a conductive area of the handle carrier covered with this anisotropic conductive glue can be in electrical contact with several of said interconnection elements of the substrate, without being electrically connected to the other conductive areas of the handle carrier.

With such a device, an electrical test can be simultaneously carried out on several of said interconnection elements without necessarily having to test simultaneously all the interconnection elements of the microelectronic device.

The anisotropic conductive glue can be formed by a dielectric or low conductive material, having adherent properties, and through which conductive elements or inserts which project from this dielectric material pass. The conductive elements can be in the form of conductive micro or nanowires, or carbon nanotubes.

The removability of said connection means provided on the first face enables in particular the overall size of the device to be reduced once the test is carried out, and the connection between said interconnection elements to be suppressed when the microelectronic device is no longer subjected to a test.

The testing circuit can be integrated to the microelectronic device.

Advantageously, the testing circuit is in particular integrated to said substrate.

According to a first possibility of implementation, this testing circuit can comprise at least one logic gate, in particular means forming an OR logic gate or an AND logic gate, connected to interconnection elements of said first plurality of interconnection elements. It is thus possible to implement a testing device with simple logic functions and having a restricted overall size.

The testing circuit can further comprise charging means or pulling means at the output of said logic gate, to force the output of the logic gate at a given potential.

Polarization means to apply a given potential to the removable connection means are also provided.

The conductive areas of the handle carrier can possibly be polarized with different potentials respectively.

Advantageously, in another embodiment, anti-adherent areas can also be provided.

These anti-adherent areas can correspond to localized regions of the anisotropic conductive glue the adhesion strength of which has been reduced or removed.

The present invention also relates to a method for electrically testing interconnection elements comprising the steps of:
  implementing a testing device such as previously described,
  carrying out at least one step of electrical testing of interconnection elements passing through said substrate by simultaneously applying at least one electrical signal to several of said interconnection elements and by sampling at the output of said testing circuit a signal in response to said electrical signal applied,
  removing removable connection means from said first face of the substrate.

BRIEF DESCRIPTION OF THE DRAWINGS

The present invention will be better understood upon reading the description of exemplary embodiments given by way of indicating and in no way limiting purposes, making reference to the appended drawings wherein:

FIG. 1 represents a first example of a device for electrically testing interconnections formed by conductive elements passing through a substrate and provided with one end connected to an electrical testing circuit and another end connected to means temporarily carrying out an electrical connection of at least several of said conductive elements;

FIG. 2 illustrates a second example of an electrical testing device, wherein chips formed on a substrate are provided with conductive elements passing through the substrate and connected through one of their ends to an electrical testing circuit, these conductive elements having another end connected to a removable connection island and temporarily provided against the substrate for the duration of an electrical test;

Identical, similar or equivalent parts of the different figures bear the same reference numerals so as to facilitate switching from one figure to the other.

Figure 3:
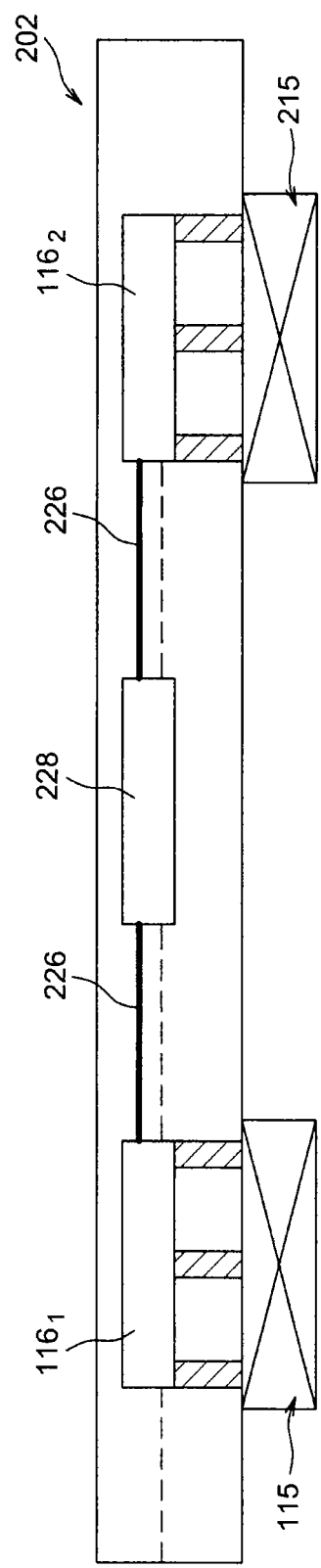
FIG. 3 illustrates a third example of an electrical testing device, wherein several chips formed on a substrate are each provided with a plurality of conductive elements passing through the substrate and each associated with an electrical testing circuit, one or more of said testing circuits being connected to each other.

Different parts represented in the figures are not necessarily drawn at a uniform scale, for making the figures more understandable.

DETAILED DISCLOSURE OF PARTICULAR EMBODIMENTS

A first example of device for implementing electrical test(s) on one or several TSV type interconnection elements provided in a chip, is given in FIG. 1.

In this example, a chip 102 includes TSV type interconnection elements 107a, 107b, 107c passing at least partly through the thickness of a carrier. This carrier can in particular be a semi-conductor substrate, on which or from which the chip 102 is formed.

These connection elements 107a, 107b, 107c include a conductive portion or conductive area passing through the thickness of the semi-conductor substrate.

This conductive portion can for example be in the form of a post, possibly in contact with one or more so-called "redistribution" conductive layers and/or with one or more conductive beads. The conductive portion can be metallic and for example based on copper or aluminium, or comprise a silver, gold, titanium or tin based conductive material.

The connection elements 107a, 107b, 107c can be each surrounded with an area of dielectric material enabling an insulation relative to the substrate to be made.

The semi-conductor substrate 100 can have been thinned and have a thickness between for example 1 and 200 micrometers.

On one side of the chip 102, for example on the side of a first face of the substrate which will be called "upper face", a first end of the connection element(s) 107a, 107b, 107c is connected to a testing circuit 116.

On the other side of the chip 102, for example on the side of a second face of the substrate opposite to the first face which will be called "lower face", a second end of the connection element(s) 107a, 107b, 107c is in contact with a connection island 115.

This connection island 115 enables an electrical contact to be set between the interconnection elements 107a, 107b, 107c or between several of the interconnection elements 107a, 107b, 107c.

The connection island 115 is also removable, that is it can be dissociated or disassembled from the chip 102, and in particular without damaging the same. The connection island 115 can also be provided so as to be temporarily assembled with the chip 102, for the duration of one or more electrical tests performed on the TSV elements 107a, 107b, 107c.

Thus, in FIG. 1, the device is represented in a testing phase, when the connection island 115 is connected to the TSV elements 107a, 107b, 107c. When this testing phase is completed, the connection island 115 is preferably removed.

The testing circuit 116 can as for it be integrated to the chip 102 and formed by so-called "front-end-of-line" (FEOL) or "front end", in particular transistors, as well as so-called "back-end-of-line" (BEOL) or "back end" elements, in particular metal interconnections.

The testing circuit 116 can be provided to make a connection with each TSV type interconnection element 107a, 107b, 107c taken singly and/or to make a connection with a group of interconnection elements 107a-107b, or 107b-107c, or 107a-107c, or with the assembly 107a-107b-107c of all the TSV interconnection elements of the chip 102.

Thus, an electrical test can be performed on a group of interconnection elements 107a-107b, or 107b-107c, or 107a-107c, or even on the assembly of all the TSV interconnection elements of the chip 102. This test can in particular be that of the electrical conductivity of the interconnection elements 107a, 107b, 107c.

The testing circuit 116 can also be associated with DFT elements or at least one DFT (for "Design for Test" or "Design for Testability") circuit, for example a DFT circuit using a testing technique such as described in document "Scan Chain Design for Test Time Reduction in Core-Based ICs" Joep Aerts and Erik Jan Marinissen, IEEE Test Conference, 1998.

The DFT circuit can be formed by logic blocks temporarily connected during a testing phase, through which a data string passes which will be recovered at the output to ensure continuity and functionality of the logic blocks.

A second example of an electrical testing device is illustrated in FIG. 2.

In this example, a chip 202 is provided with a first assembly of connection elements 107a, 107b, 107c passing through at least one part of the thickness of a substrate on which this chip is formed, these interconnection elements 107a, 107b, 107c being connected on one side of the substrate to a first integrated testing circuit 116, and on another side of the substrate, to a first connection island 115 temporarily assembled with the chip 202.

The chip 202 also includes a second assembly of connection elements 207a, 207b, 207c passing through at least one part of the thickness of the substrate and juxtaposed to the first assembly of connection elements 107a, 107b, 107c. The connection elements 207a, 207b, 207c include one end connected to a second testing circuit 216 and the other end to a second connection island 215 temporarily adjoining the chip 202.

The first connection island 115 and the second connection island 215 are also removable and likely to be removed from the face of the substrate into which the connection elements 107a, 107b, 107c, 207a, 207b, 207c open.

The first testing circuit 116 and the second testing circuit 216 are as for them connected to each other through an interconnection line 226, which can be for example one of the metal lines of the chip 202 which are parallel to the substrate 100 and belonging to the back-end area of the chip 202.

The first testing circuit 116 and the second testing circuit 216 can be configured such that one or more elements of the first assembly of interconnection elements 107a, 107b, 107c are likely to be connected to one or more interconnection elements of the second assembly of interconnection elements 207a, 207b, 207c.

The testing circuits 116 and 216 can be configured so as to select and connect several elements among the TSV type interconnection elements 107a, 107b, 107c of the first assembly with several elements among the TSV type interconnection elements 207a, 207b, 207c of the second assembly.

A series chaining of pairs of TSV interconnection elements can thus be made.

FIG. 3 illustrates an alternative of the example of device previously described, for which a logic circuit 228 or an assembly 228 of logic circuits is provided between the first testing circuit 116 and the second testing circuit 216 and connected to the same.

The logic circuit 228 or the assembly 228 of logic circuits can be provided with a functional logic block of the type commonly called "intellectual property" or PI, possibly associated with one or more DFT type elements.

Figure 12:
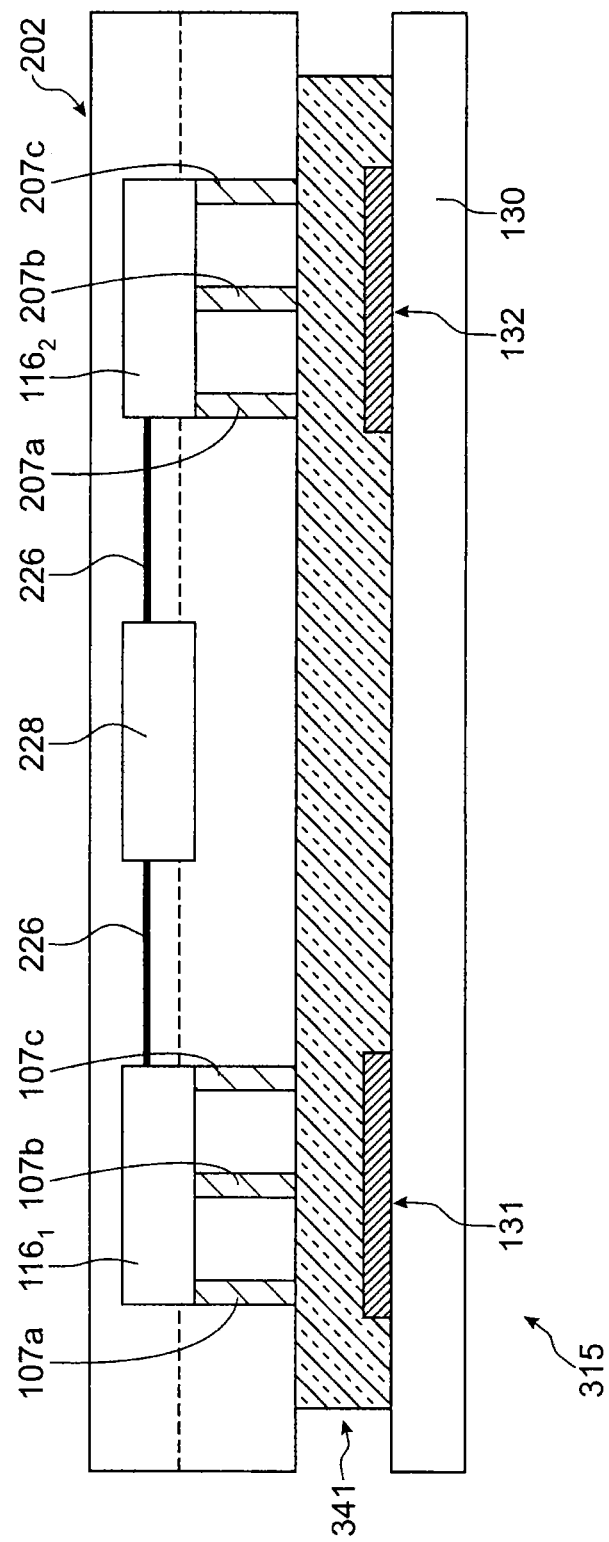
FIG. 12 illustrates an example of an electrical testing device for interconnections wherein conductive interconnection elements passing through a substrate and provided with one end connected to an electrical testing circuit have another end connected to a conductive area of a handle carrier to make temporarily an electrical connection between at least several of said conductive interconnection elements, the handle carrier and substrate being assembled through an anisotropic conductive glue.

FIG. 12 illustrates another alternative of either of the examples previously described, wherein a removable connection island 315 is in the form of a substrate or handle carrier 130, provided with a first conductive area 131, and a second conductive area 132, the first conductive area 131 enabling the elements 107a, 107b, 107c of the first assembly of interconnection elements to be electrically connected, whereas the second conductive area 131 enables the elements 207a, 207b, 207c of the second assembly of interconnection elements to be electrically connected respectively. The conductive areas 131, 133 have an arrangement which depends on that of the interconnection elements 107a, 107b, 107c, 207a, 207b, 207c in the chip 202.

The assembly of the handle carrier 130 to the chip 202 is performed by means of an anisotropic conductive glue 341 which can be formed, for example according to a technique presented in document CN1821336, by mixing conductive particles with filling nanoparticles called "filler", the mixture being combined with an epoxy type resin and a slow crosslinking agent. Because of the anisotropic conductivity of the glue 341, the conductive areas 131, 133 of the handle carrier are not electrically connected to each other.

An electrical test can thus be performed on the first assembly of interconnection elements 107a, 107b, 107c, and then on the second assembly of interconnection elements 207a, 207b, 207c.

Figure 13:
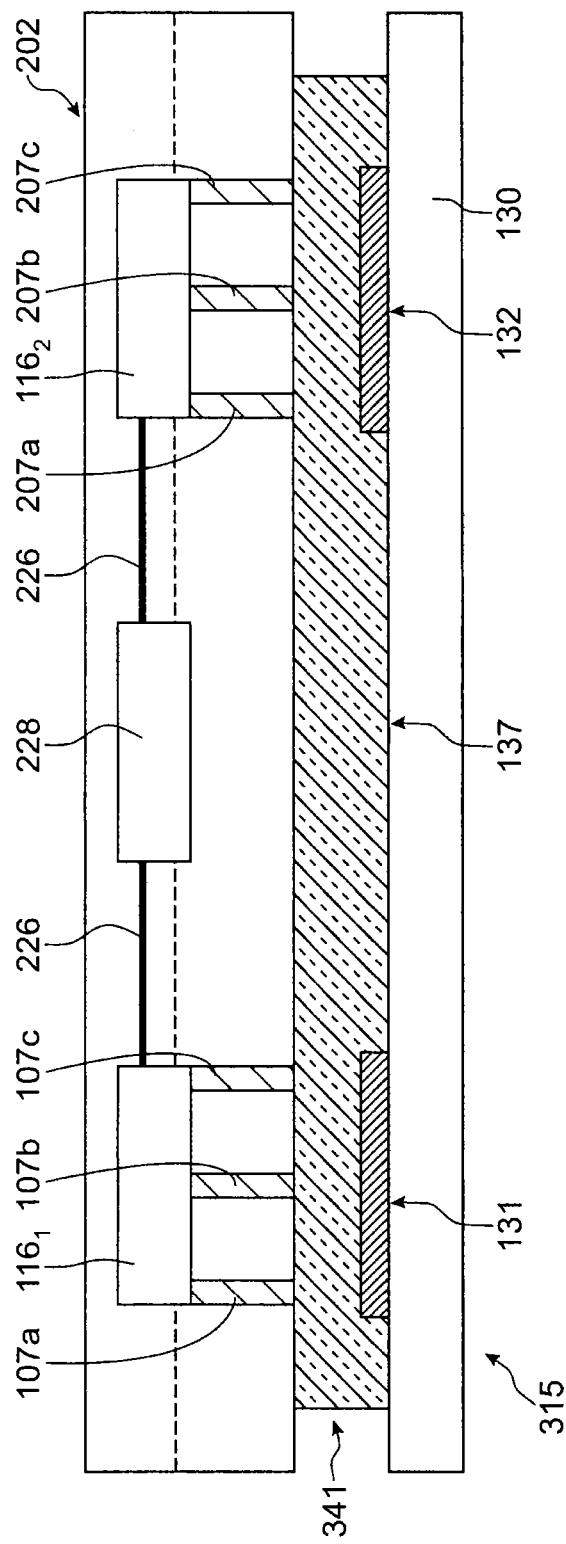
FIG. 13 illustrates an example of device similar to that of FIG. 12, but wherein the handle carrier is covered with anti-adherent areas to facilitate the subsequent removal of the handle carrier.

In the example of embodiment of FIG. 13, the anisotropic conductive glue 341 is provided on a face of the handle carrier 130 on which conductive areas 131, 132 are arranged. Around the conductive areas 131, 132, anti-adherent areas 137 are provided to enable the subsequent disassembly between the chip 202 and the handle carrier 130 to be facilitated.

The adherent areas 137 can correspond to regions of the glue 341 the adhesion properties of which have been reduced or removed. This can be performed by exposing regions of the glue to a chemical process which reduces its adhesion strength, such as described for example in the process published in "Ultrathin Wafer Handling in 3D Stacked IC Manufacturing Combining a Novel Zone-BOND™ Temporary Bonding Process with Room Temperature Peel Debonding<<, proceedings of 3DIC, 2011."

Figure 4:
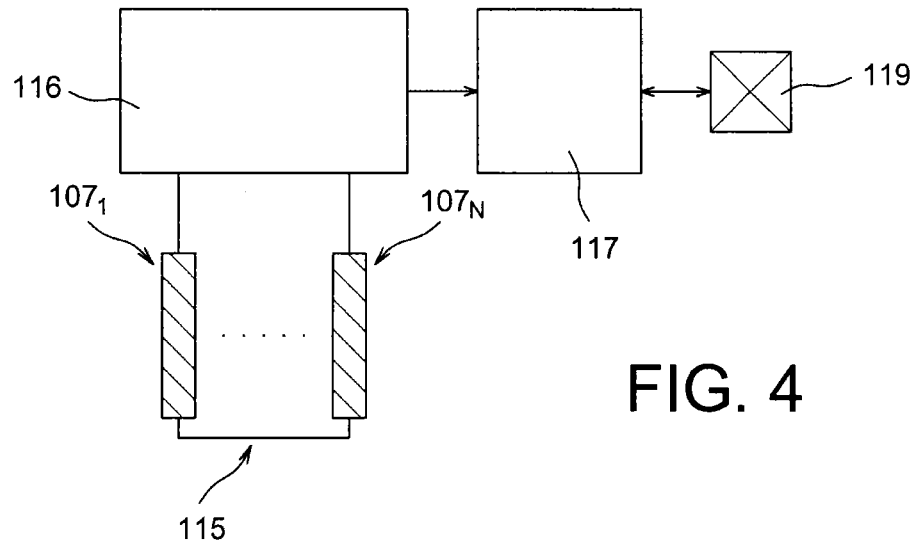
FIG. 4 illustrates an example of an electrical testing device, for TSV type interconnection elements both connected to a temporary connection island and to an integrated electrical testing circuit, this testing circuit being associated with an evaluation circuit.

In FIG. 4, a block diagram of a testing device of the type of that previously described in connection with FIG. 1 is given.

The testing circuit 116 can be provided to inject a current or apply a potential or measure the current or the potential at one or more end(s) of the TSV type connection elements $107_1, \ldots, 107_N$.

A potential can possibly be applied to connection island 115 through 107N, for example enabling the other interconnection elements 1071 to 107N-1 to be connected to each other in order to polarise another end of the other TSV type connection elements 1071 to 107N-1.

In this exemplary embodiment, the electrical testing device is also provided with an evaluation circuit 117 connected to one or more test input and/or output pad(s) 119.

This evaluation circuit 117 is adapted to indicate a possible presence of functional or parametric errors. The circuit 117 can be provided to assess for example the electrical continuity of each TSV element through a current or electrical potential characterising each TSV.

Figure 5:
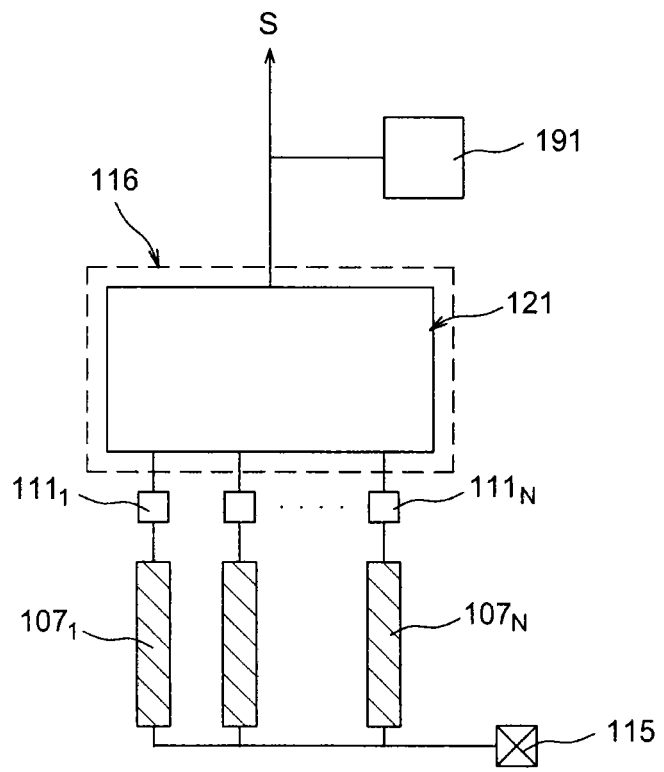
FIGS. 5, 6, 7 illustrate different examples of electrical testing devices for TSV type interconnection elements connected to a testing circuit performing a logic function.
Figure 6:
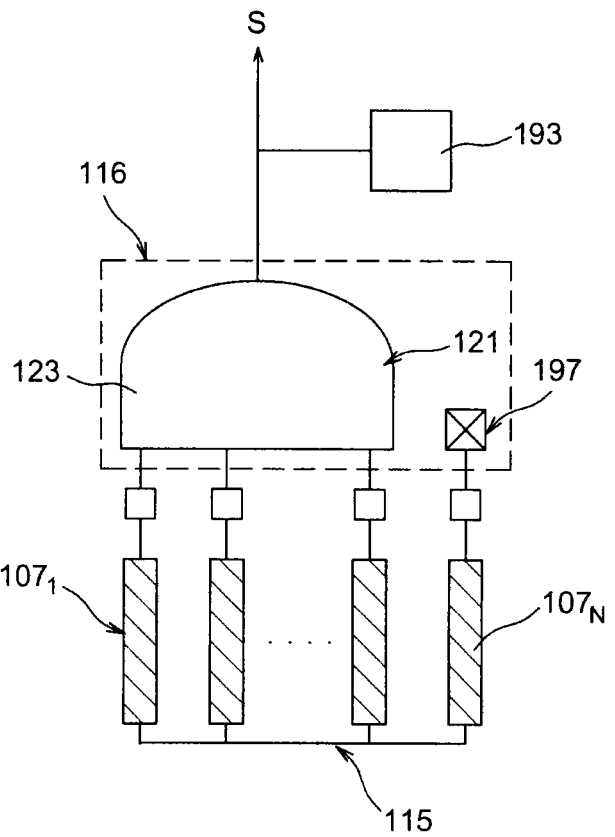
Figure 7:
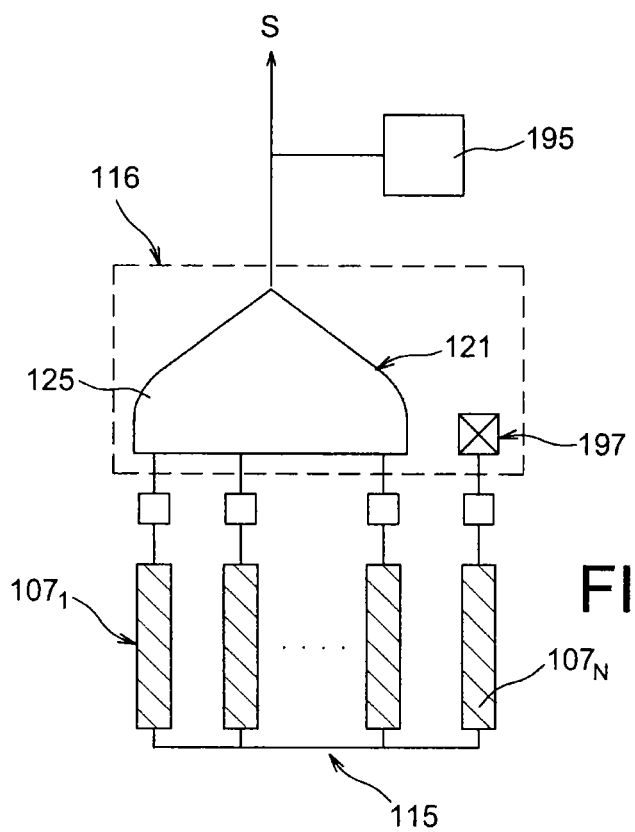

This evaluation circuit can for example be formed by a comparator which compares an output of the device of FIGS. 5, 6 and 7 to an expected value.

In FIG. 5, an embodiment of a testing device including a testing circuit 116 provided with means 121 to make a connectivity test of the TSV type interconnection elements $107_1, \ldots, 107_N$ is given.

A potential V is applied on TSV type connection elements $107_1, \ldots, 107_{N-1}$ through a connection island 115 polarised through $107_N$.

The means 121 implementing a connectivity testing function can be provided to indicate, for example, whether all the TSV connection elements 107 are placed at a same potential or not.

Charging or pulling means 191 can be further connected at the output of the testing circuit 116, in order to force this output to a determined potential. The signal at the output of the testing circuit 116 can be delivered to an evaluation circuit.

In this exemplary embodiment, multiplexing elements $111_1, \ldots, 111_N$ respectively associated with the connection elements $107_1, \ldots, 107_N$ are provided to enable one end of the connection elements $107_1, \ldots, 107_N$ to be alternately connected to a testing circuit or to another stage, depending on whether the microelectronic device including the TSV connection elements $107_1, \ldots, 107_N$ is in electrical testing mode or normal operating mode.

According to a particular embodiment (FIG. 6), the means 121 performing the connectivity testing function, can comprise means 123 forming an "AND" logic gate as well as a polarisation pad 197.

In this case, a potential V equivalent to a logic "1" is applied to the connection island 115 via the polarisation pad 197, and a result of this testing function is extracted at the output S of the testing circuit 116.

In the case where this result at the output S is a logic "1", then it can be deduced therefrom that all the TSV elements 107 are conductive.

For this particular embodiment, pulling means 193 commonly called "pull up", for example in the form of one or more transistors and/or resistors connected to a power supply, can be provided at the output of the testing circuit 116, and force this output to the "1" or high state.

According to another embodiment (FIG. 7), the means 121 performing the connectivity testing function can comprise means 125 forming an "OR" logic gate as well as a polarisation pad 197. In this case, a potential V equivalent to a logic "0" is applied, and a result of this testing function is extracted at the output S of the circuit 116. In the case where this result at the output S is a logic 0, it can then be deduced therefrom that all the TSV elements 107 are conductive. In the case where a floating signal is extracted at the output, then at least one of the TSV elements 107 is not conductive.

For this particular embodiment, pulling means 195 of the type commonly called "pull down", for example in the form of one or several "pull down" transistors and/or resistors connected to the ground, can be provided at the output of the testing circuit 116, and force this output to a low or "0" state.

According to another possible embodiment, an arrangement including logic gates in cascade with sandwiched DFT testing logic circuits can be implemented.

Figure 8:
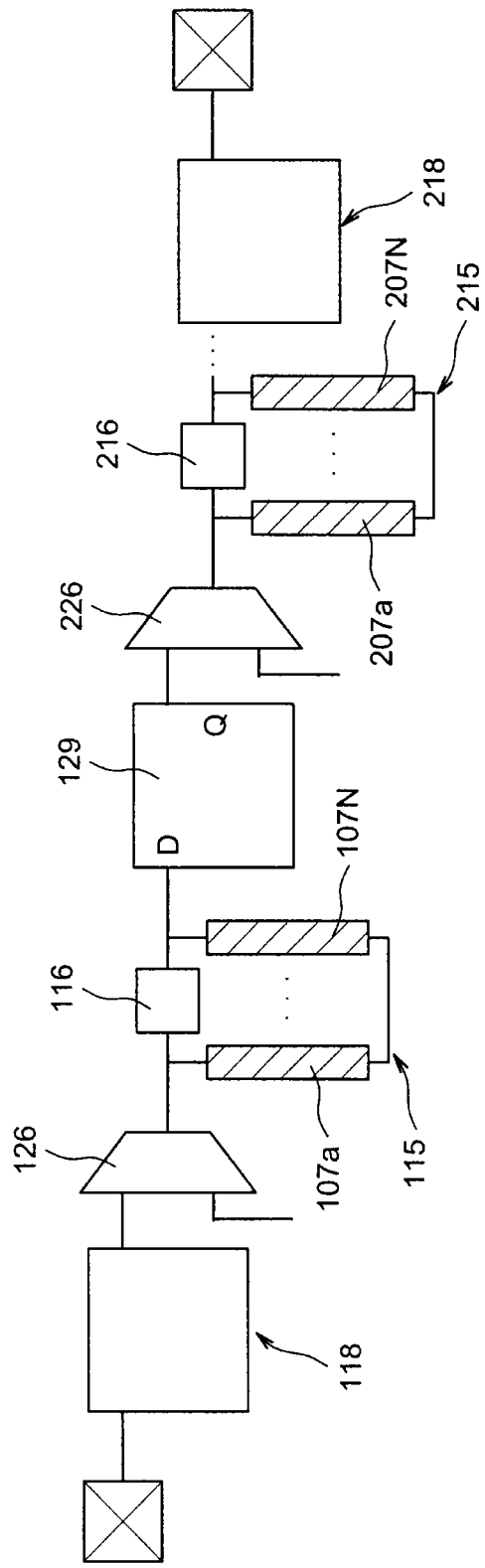
FIG. 8 illustrates an example of an electrical testing device for series of testing TSV type interconnection elements performing a logic function.

In the exemplary device of FIG. 8, the TSV connection elements $107a, \ldots, 107_N, 207a, 207_N$ are placed in series and tested through scan chain control means 118, 218 commonly called "scan chain".

In such a configuration, a first series of TSV elements $107a, \ldots, 107_N$ connected through a connection island 115 are connected to another series of TSV elements $207a, \ldots, 207_N$ connected to another connection island 215. At the input of each series of TSV elements, a multiplexer 126, 226 can be provided which connects this series to a scan chain or even to an electronic circuit, depending on the state of a logic selector (not represented).

At the output of a series of TSV elements TSV $107a, \ldots, 107_N$, a flip-flop 129 enabling a piece of information to be saved, can be connected to the multiplexer 226 provided at the input of a following series of TSV elements.

When a sequence of signals is injected to one end of a scan chain, this sequence arrives at an opposite end of the chain after a certain time interval and is extracted.

If this extracted sequence is correct, then it can be concluded that no TSV element is defective. If this sequence is modified or attenuated, for example with respect to the sequence injected at the input, it can be deduced therefrom that at least one TSV element is failing.

Figure 9:
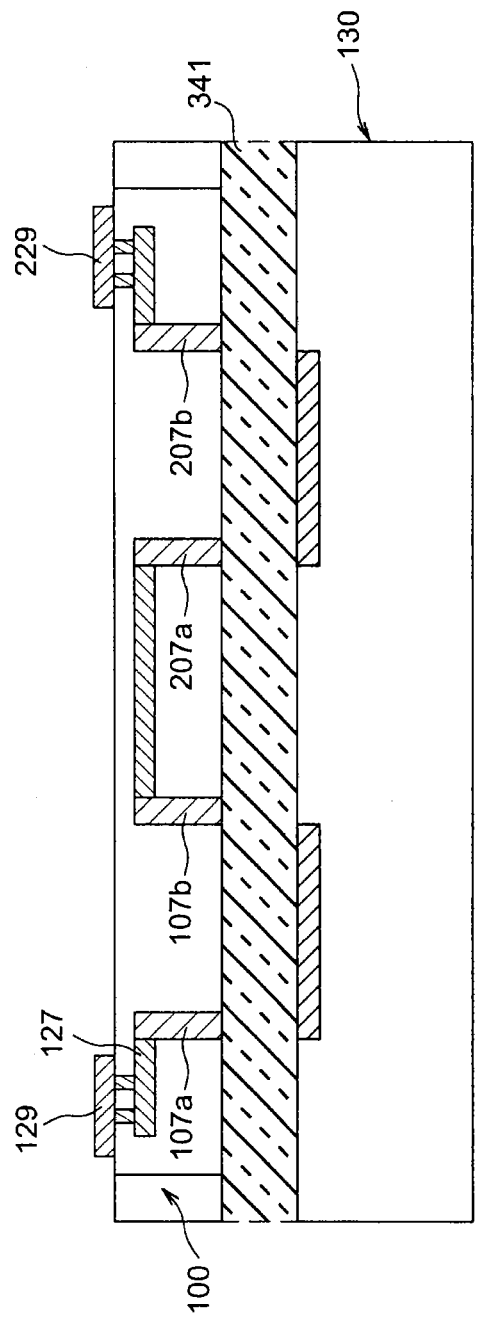
FIG. 9 illustrates an example of particular arrangement of an electrical testing device.

Another exemplary embodiment is given in FIG. 9, with TSV interconnection elements not passing through the entire thickness of the substrate. An interconnection element 107a has one end opening into the lower face of the substrate 100 and another end provided in the thickness of the substrate 100, but connected through a horizontal conductive line 127 to a conductive pad 129 formed on the upper face of the substrate 100.

Figure 10:
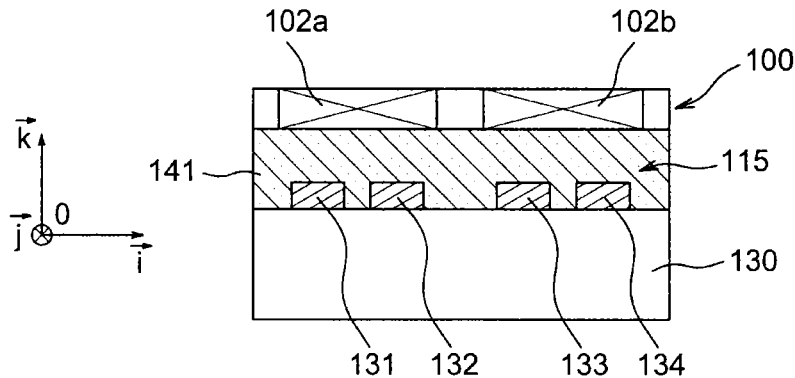
FIG. 10 illustrates an arrangement of removable connection islands provided for implementing an electrical test on TSV type interconnection elements of a microelectronic device, the connection islands being provided to connect several TSV type interconnection elements during an electrical testing phase and being intended to be removed once this testing phase is completed.

In the exemplary embodiment of FIG. 10, a substrate 100 including several chips 102a, 102b each provided with a plurality of TSV interconnection elements (not represented) are connected to conductive areas 131, 132, 133, 134 provided on a temporary handle carrier 130.

The handle carrier 130 can for example be a silicon or glass based plate, enabling a rigid maintenance of the testing device to be ensured and can also be provided with a size similar to that of the thinned semi-conductor substrate 100 on which the chips 102a, 102b are formed.

An anisotropic conductive glue 141 is provided between the handle carrier 130 and the substrate 100 to ensure the assembling and anisotropic electrical conduction, that is in a preferential conduction direction which, in this example, makes a non-zero angle, in particular 90°, with a plane parallel to the main plane of the carrier 130 of the substrate 100 (the main planes of the carrier 130 and the substrate being planes respectively passing through the carrier and the substrate and which are parallel to the plane $[O; \vec{i}; \vec{j}]$ of the reference frame $[O; \vec{i}; \vec{j}; \vec{k}]$ given in FIG. 10).

The anisotropic type conductive glue 141 can have been formed by an adhesive low conductive material to which conductive particles passing through the material, for example metal nanowires or nanoparticles or carbon nanotubes have been added.

The example of assembly illustrated in FIG. 10 can be temporarily maintained, during one or more electrical testing phases of the interconnection elements provided in the chips 102a, 102b formed in the substrate 100.

Once this testing phase(s) is (are) performed, the carrier 130 and the substrate 100 can be disassembled. The handle carrier 130 and the connection islands 115 can thus be detached from the substrate 100. This can be made by etching the conductive glue 141. The anisotropic conductive glue 141 can be based on a polymer which can be etched chemically or selectively through plasma with respect to the substrate 100 and the carrier 130.

Figure 11A:
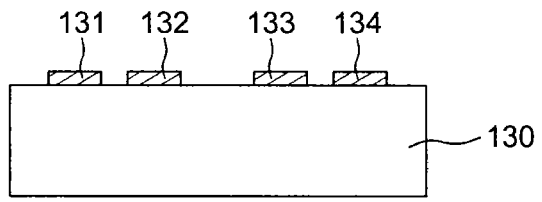
FIGS. 11A-11C illustrate an example of implementation of a method of manufacturing connection islands intended for the implementation of an electrical test on TSV type interconnection elements.
Figure 11B:
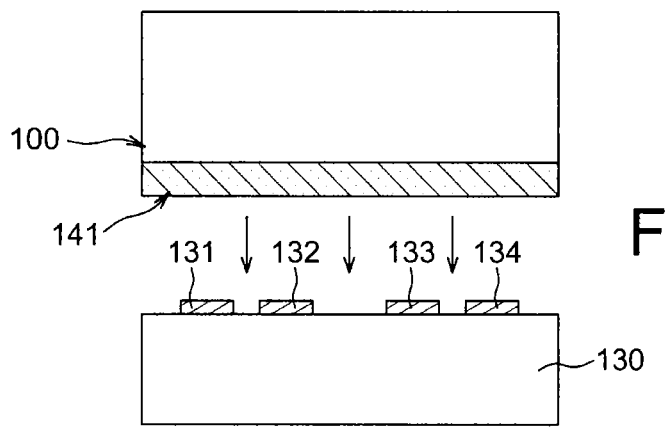
Figure 11C:
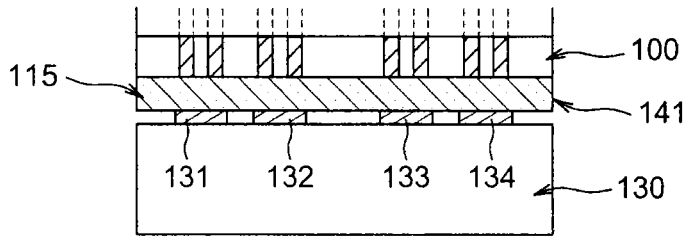

FIGS. 11A-11C illustrate an exemplary method of making connection islands and assembling these connection islands with a microelectronic device provided with TSV type interconnection elements.

On a carrier 130 intended to act as a handle carrier, a metal layer is formed wherein patterns are made, for example using photolithography or screen-printing steps, in order to form metal areas 131-134. The metal areas 131-134 that are made have an arrangement which depends on that of TSV interconnection elements in a microelectronic device with which the handle carrier 130 is intended to be assembled (FIG. 11A).

This microelectronic device is formed by a semi-conductor substrate 100 wherein the TSV interconnection elements are provided (the TSV interconnection elements being not represented in FIGS. 11A-11C).

Then, the substrate 100 and the handle carrier 130 are assembled (FIG. 11B), such that a face of the substrate 100 into which one end of the interconnection elements opens, is covered with a layer of anisotropic conductive glue 141. The face of the substrate 100 which is covered with the anisotropic conductive glue 141 is then contacted with that of the carrier 130 on which the metal areas 131-134 are arranged.

The anisotropic conductive glue 141 formed on the handle carrier 130 can have a thickness between for example several micrometers and several tens micrometers. This conductive glue 141 can be for example based on an insulating polymer mixed with metal nanoparticles or nanowires or nanotubes.

In this example, connection islands 115 formed by a layer of anisotropic conductive glue 141 in contact with at least one metal area 131-134 are made (FIG. 11C). During the transfer of the substrate 100 onto the carrier 130, a mechanical or optical alignment is implemented to ensure alignment of the metal areas 131-134 with TSV elements.

Following the testing operation, the carrier 130 is for example removed by a chemical attack of the glue 141. The substrate 100 is recovered and then can be glued on a thick adhesive ensuring a certain rigidity in spite of the small thickness of the substrate 100.

Connection islands are provided on a handle carrier 130 which also acts to provide the assembly with a rigidity during the electrical test(s) intended to be subsequently performed on the microelectronic device.

The invention claimed is:

1. A device for electrically testing a microelectronic device, comprising:
    at least a first plurality of interconnection elements passing through a substrate and including a first end located at a first face of the substrate and a second end connected to a testing circuit,
    removable connection means, provided on the first face of the substrate, for enabling a temporary short-circuit to be set between plural interconnection elements, the first end of the interconnection elements being connected to the removable connection means,
    wherein the testing circuit comprises means for simultaneously applying through the interconnection elements at least one connectivity testing electrical signal, between plural interconnection elements of the first plurality of interconnection elements, and for sampling at an output of the testing circuit a signal in response to the connectivity testing signal,
    wherein the removable connection means comprises a handle carrier comprising distinct conductive areas assembled to the substrate through an anisotropic conductive glue,
    wherein the testing circuit comprises at least one logic gate connected to interconnection elements of the first plurality of interconnection elements and configured to allow a simultaneous connectivity test of the interconnection elements, and
    wherein respective different potentials are applied to the conductive areas of the handle carrier.

2. The electrical testing device according to claim 1, wherein the testing circuit is integrated into the substrate.

3. The electrical testing device according to claim 1, wherein the testing circuit further comprises charging means or pulling means at an output of the gate, to force the output of the gate at a given potential.

4. The electrical testing device according to claim 1, wherein the removable connection means is polarized and connected to the handle carrier.

5. The electrical testing device according to claim 1, wherein the microelectronic device includes a second plurality of interconnection elements passing through the substrate, the second plurality of interconnection elements being connected to another testing circuit, the second testing circuit being connected to the first testing circuit.

6. The electrical testing device according to claim 1, wherein the testing circuit comprises a DFT type circuit.

7. The electrical testing device according to claim 1, wherein the handle carrier is further covered with anti-adhesive areas.

8. A method for electrically testing interconnection elements using the device according to claim 1, comprising:
    carrying out at least one electrical testing of interconnection elements passing through the substrate by simultaneously applying at least one electrical signal through plural of the interconnection elements and by sampling, at the output of the testing circuit, a signal in response to the electrical signal applied; and removing the removable connection means from the first face of the substrate.

9. A device for electrically testing a microelectronic device, comprising:
- at least a first plurality of interconnection elements passing through a substrate and including a first end located at a first face of the substrate and a second end connected to a testing circuit,
- removable connection means, provided on the first face of the substrate, for enabling a temporary short-circuit to be set between plural interconnection elements, the first end of the interconnection elements being connected to the removable connection means, and
- means for simultaneously applying through the interconnection elements at least one connectivity testing electrical signal between plural interconnection elements of the first plurality of interconnection elements and for sampling at an output of the testing circuit a signal in response to the connectivity testing signal,
- wherein the removable connection means comprises a handle carrier comprising distinct conductive areas assembled to the substrate through an anisotropic conductive glue, and
- wherein respective different potentials are applied to the conductive areas of the handle carrier.

10. The electrical testing device according to claim 9, wherein the testing circuit is integrated to the substrate.

11. The electrical testing device according to claim 9, wherein the testing circuit further comprises charging means or pulling means at an output of the gate, to force the output of the gate at a given potential.

12. The electrical testing device according to claim 9, wherein the removable connection means is polarized and connected to the handle carrier.

13. The electrical testing device according to claim 9, wherein the microelectronic device includes a second plurality of interconnection elements passing through the substrate, the second plurality of interconnection elements being connected to another testing circuit, the second testing circuit being connected to the first testing circuit.

14. The electrical testing device according to claim 9, wherein the testing circuit comprises a DFT type circuit.

15. The electrical testing device according to claim 9, wherein the handle carrier is further covered with anti-adhesive areas.

16. The electrical testing device according to claim 9, wherein the testing circuit includes at least one logic gate connected to interconnection elements of the first plurality of interconnection elements and configured to allow a simultaneous connectivity test of these interconnection elements.

17. A method for electrically testing the interconnection elements using the device of claim 9, comprising:
- carrying out at least one electrical testing of interconnection elements passing through the substrate by simultaneously applying at least one electrical signal through plural of the interconnection elements and by sampling at the output of the testing circuit a signal in response to the electrical signal applied; and
- removing the removable connection means from the first face of the substrate.

* * * * *